United States Patent
Zhuang et al.

(10) Patent No.: US 9,846,757 B2
(45) Date of Patent: Dec. 19, 2017

(54) CELL GRID ARCHITECTURE FOR FINFET TECHNOLOGY

(71) Applicant: TAIWAN SEMICONDUCTOR MANUFACTURING CO., LTD., Hsin-Chu (TW)

(72) Inventors: Hui-Zhong Zhuang, Kaohsiung (TW); Ting-Wei Chiang, New Taipei (TW); Chung-Te Lin, Tainan (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/843,805

(22) Filed: Sep. 2, 2015

(65) Prior Publication Data

US 2017/0061056 A1   Mar. 2, 2017

(51) Int. Cl.
*G06F 17/50* (2006.01)
*H01L 27/02* (2006.01)

(52) U.S. Cl.
CPC ...... *G06F 17/5072* (2013.01); *H01L 27/0207* (2013.01)

(58) Field of Classification Search
USPC .......................... 716/122, 135; 365/104, 154
See application file for complete search history.

(56) References Cited

U.S. PATENT DOCUMENTS

| | | | |
|---|---|---|---|
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 2010/0269081 A1* | 10/2010 | Hou ............... | G06F 17/5068 716/123 |
| 2011/0069527 A1* | 3/2011 | Liaw ............... | G11C 17/12 365/104 |
| 2011/0075470 A1* | 3/2011 | Liaw ............... | G11C 8/16 365/154 |
| 2014/0264924 A1 | 9/2014 | Yu et al. | |
| 2014/0282289 A1 | 9/2014 | Hsu et al. | |
| 2015/0067624 A1* | 3/2015 | Tam ............... | G06F 17/5081 716/111 |

(Continued)

*Primary Examiner* — Brian Ngo
(74) *Attorney, Agent, or Firm* — Duane Morris, LLP (57) ABSTRACT

A layout of a cell grid comprises a plurality of polycrystalline silicon (POLY) lines in the cell gird, wherein the POLY lines are arranged horizontally and evenly spaced with a pitch X, and a plurality of fin-shaped oxide diffused (OD) regions in the cell gird, wherein the fin-shaped OD regions are arranged vertically and evenly spaced with a pitch Y, wherein the pitch Y of the fin-shaped OD regions defines width of the cell grid. The layout of the cell grid further comprises a plurality of PMOS transistors and NMOS transistors in the cell grid, wherein the PMOS transistors and NMOS transistors have their source nodes and drain nodes formed in the fin-shaped OD regions and their gates connected to the POLY lines, wherein the plurality of PMOS transistors and NMOS transistors are connected together to form one or more CMOS devices in the cell grid.

20 Claims, 7 Drawing Sheets

(56) References Cited

U.S. PATENT DOCUMENTS

| | | | |
|---|---|---|---|
| 2015/0109025 A1* | 4/2015 | Marimuthu | H01L 27/0207 326/58 |
| 2015/0279453 A1* | 10/2015 | Fujiwara | G11C 8/14 365/154 |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |
| 2016/0012169 A1 | 1/2016 | Chiang et al. | |

\* cited by examiner

CELL GRID ARCHITECTURE FOR FINFET TECHNOLOGY

FIELD OF THE INVENTION

This disclosure relates to semiconductor fabrication generally, and more specifically to cell grid architecture for Fin field effect transistors (FinFETs).

BACKGROUND

In the rapidly advancing semiconductor manufacturing industry, complementary metal oxide semiconductor (CMOS) FinFET devices are favored for many logic and other applications. Thus FinFET devices are integrated into various types of semiconductor devices currently being manufactured. FinFET devices typically include a plurality of fin-shaped oxide diffused (OD) regions with high aspect ratios formed vertically with respect to a top surface of the substrate, wherein the fin-shaped OD regions define the active areas in which channel and source/drain regions of the CMOS transistor devices are formed. Typically, the fin-shaped OD regions are isolated, raised three-dimensional (3D) structures. Gates of the CMOS FinFET devices are formed over and along the sides of the fins, utilizing the advantage of an increased surface area of the channel and source/drain regions to produce faster, more reliable and better-controlled semiconductor transistor devices. Polycrystalline silicon (POLY) lines are used for carrying control signals to the gates of the CMOS transistors wherein the gates may also be made of POLY in some embodiments.

A cell grid is a cell structure that implements various CMOS transistors in a circuit with the fin-shaped OD regions and the POLY lines running in orthogonal directions on separate layers formed on a semiconductor substrate. The height of the cell grid is optimally chosen for the circuit during circuit design while the width of the cell grid is determined by the number of CMOS devices implemented in the cell grid. The larger the number of CMOS devices implemented, the larger the width and thus the area of the cell grid.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or one or more intervening elements may be present.

In accordance with some embodiments, both the fin-shaped OD regions and the POLY lines used in a cell grid architecture are uniformly and evenly spaced and the spacing between a pair of adjacent fin-shaped OD regions or POLY lines is referred to as the pitch of the fin-shaped OD regions or the POLY lines, respectively. In one embodiment, the width of the cell grid can be defined either by multiplying the pitch of the POLY lines with the number of the POLY lines used by the cell grid, or by multiplying the pitch of the fin-shaped OD regions with the number of the fin-shaped OD regions used by the cell grid, as discussed in further detail below. As semiconductor fabrication technology advances, the pitch of the fin-shaped OD regions continues to decrease, and in some embodiments, is less than the pitch of the POLY lines.

In accordance with some embodiments, a cell grid architecture having a width defined by the pitch of the fin-shaped OD regions can be adopted for laying out and fabricating a semiconductor cell grid/circuit having a plurality of CMOS devices using a FinFET process. Here, the width of the cell grid is determined by the pitch of the fin-shaped OD regions multiplied by the number of the fin-shaped OD regions used by the cell grid. When the pitch of the fin-shaped OD regions is less than the pitch of the POLY lines, the width of a cell grid defined by the pitch of the fin-shaped OD regions is smaller than the width of a cell grid defined by the pitch of the POLY lines for implementing the same number of CMOS devices in the cell grid. As a result, the layout area of the cell grid is reduced by using the cell grid defined by the pitch of the fin-shaped OD regions as the height of the cell grid is already fixed during the circuit design phase.

Figure 1A:
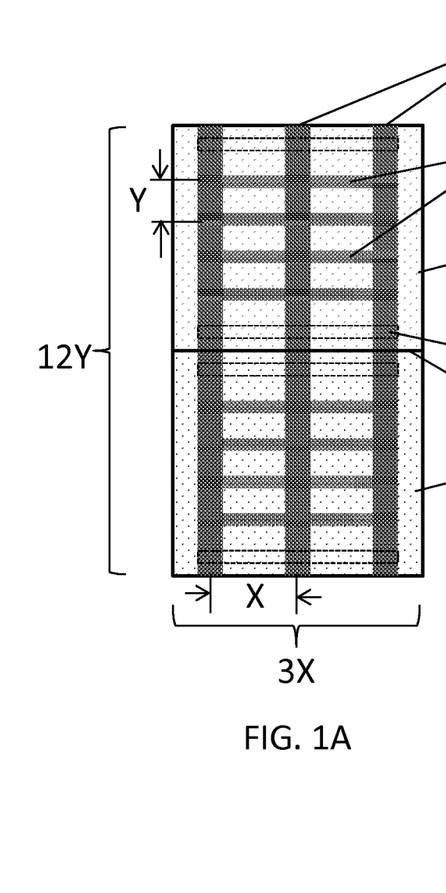
FIGS. 1A-B show exemplary plan views of two different cell grid layouts having widths defined by a pitch of the POLY lines, in accordance with some embodiments.
Figure 1B:
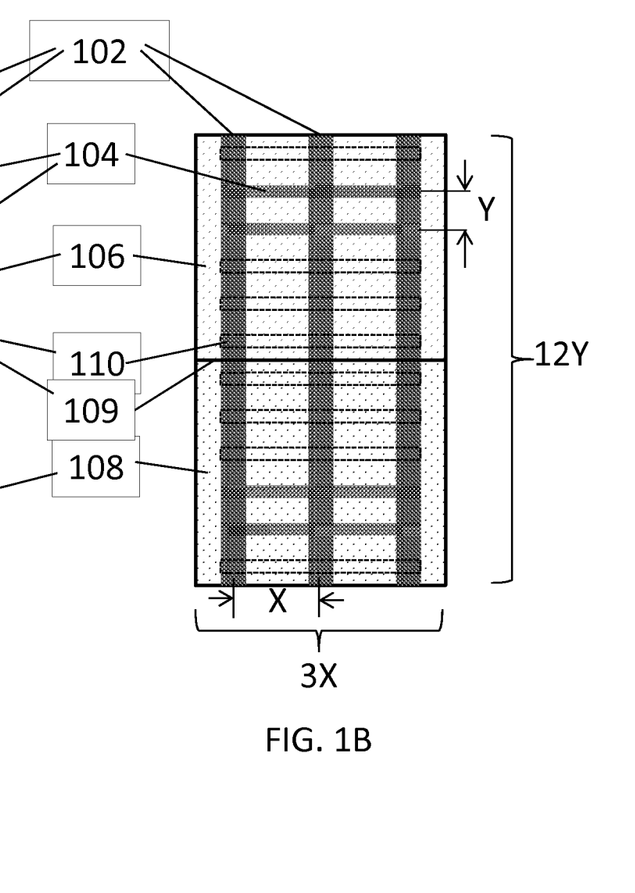

FIGS. 1A-B show plan views of two different examples of cell grid layouts having widths defined by the pitch of the POLY lines in the cell grid in accordance with FinFET device layout techniques, for example.

As shown in the examples of FIGS. 1A and 1B, each of the cell grids includes a plurality of evenly-spaced POLY lines 102 running in a first direction (e.g., vertical) and a plurality of evenly-spaced fin-shaped OD regions 104 running in a second direction (e.g., horizontal), wherein the POLY lines 102 and the fin-shaped OD regions 104 run in substantially orthogonal directions with respect to each other (e.g., vertical vs. horizontal directions) on separate layers formed on a semiconductor substrate. Each cell grid includes a N-type material 106 that is used for forming a plurality of PMOS devices and a P-type material 108 that is used for forming a plurality of NMOS devices, wherein the two types of materials shown in the top and bottom portions of the cell grid, respectively, are separated by a dividing line 109. As shown in the examples of FIGS. 1A and 1B, the pitch of the POLY lines 102 is the distance between the centerlines of two adjacent POLY lines 102 and is denoted as X. Similarly, the pitch of the fin-shaped OD regions 104 is the distance between the centerlines of two adjacent fin-shaped OD regions 104 and is denoted as Y. In the examples illustrated in FIGS. 1A and 1B, the ratio between X and Y is X=2Y, i.e., the pitch of the fin-shaped OD regions 104 is half of the pitch of the POLY lines 102.

In the example shown in FIG. 1A, the height of the cell grid, which is determined during circuit design phase and is generally not changed during layout phase of the cell grid, equals the pitch Y of the fin-shaped OD regions 104 multiplied by the number of the evenly-spaced fin-shaped OD regions 104 in the cell grid. In the example shown in FIG. 1A, the height of the cell grid is 12Y (11 spaces between 8 fin-shaped OD regions 104 and 4 unoccupied spots 110 plus 2 half spaces on the top and bottom sides of the cell grid to provide a total of 12Y). Note that some spots/locations 110 may be unoccupied by the fin-shaped OD regions 104 (i.e., not diffused with oxide) due to design rules and/or positions of the devices in the cell grid. The width of the cell grid as shown in FIG. 1A equals the pitch of the POLY lines 102 multiplied by the number of POLY lines 102 in the cell grid, which is 3X in this example (2 spaces between the 3 POLY lines 102 plus 2 half spaces on the left and right sides of the cell grid to provide a total of 3 spaces or pitches) as shown in FIG. 1A. As such, the area of the cell grid in FIG. 1A is $3X*12Y=18X^2$, since X=2Y in this example.

For another (different) example of a cell grid layout shown in FIG. 1B, although there are a fewer number of the fin-shaped OD regions 104 in the cell grid (4 in this example) due to the number and/or width of the devices in the cell grid, the height of the cell grid is pre-determined and can still be calculated as 12Y (11 spaces between 4 fin-shaped OD regions 104 and 8 unoccupied spots 110 plus 2 half spaces on the top and bottom sides of the cell grid to provide a total of 12Y). The width of the cell grid is also determined by the number of the POLY lines 102 in the cell grid as 3X (2 spaces between the 3 POLY lines 102 plus 2 half spaces on the left and right sides of the cell grid to provide a total of 3 spaces or pitches) as shown in FIG. 1B. As such, the area of the cell grid in FIG. 1B is the same as the one in FIG. 1A at $3X*12Y=18X^2$ even though there are fewer number of the fin-shaped OD regions 104 in the example (4 vs. 8 in the example of FIG. 1A).

Figures 2A, 2B:
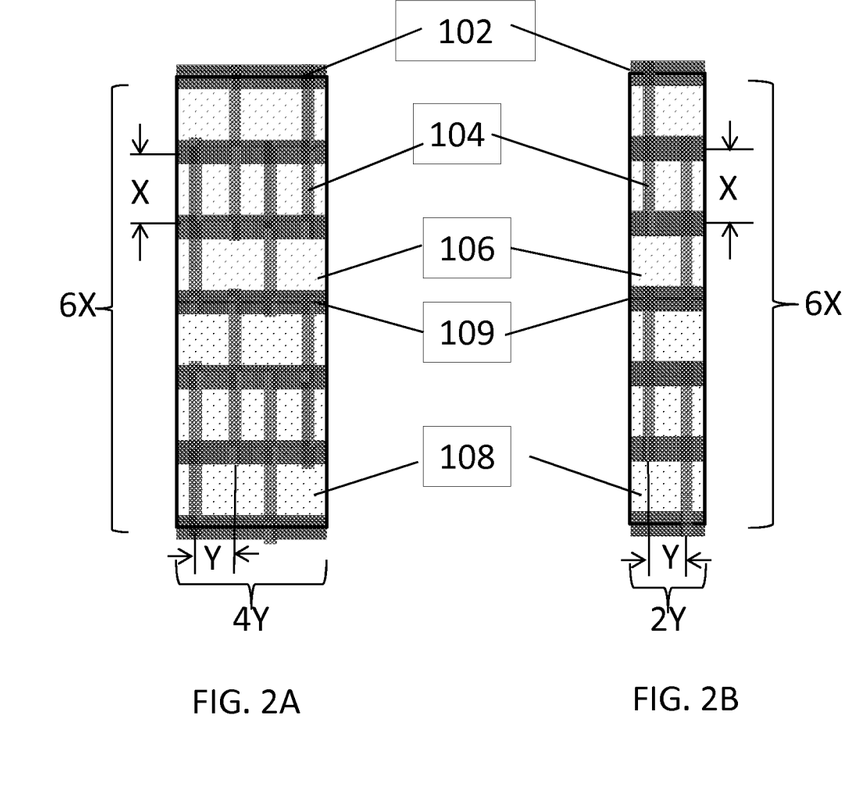
FIGS. 2A-B show plan views of the two different examples of cell grid layouts of FIGS. 1A-B, respectively, where widths of the cell grids are defined by a pitch of the fin-shaped OD regions instead of a pitch of the POLY lines, in accordance with some embodiments.

FIG. 2A shows an exemplary layout of the same cell grid of FIG. 1A, but the width of the cell grid is defined by the pitch Y of the fin-shaped OD regions 104 instead of the pitch X of the POLY lines 102. The cell grid of FIG. 2A implements the same set of transistors and devices as the cell grid of FIG. 1A. Unlike the layout of the cell grid in FIG. 1A, however, the plurality of fin-shaped OD regions 104 are now vertically placed and staggered in some cases, where multiple fin-shaped OD regions 104 are placed vertically along a horizontal direction (e.g., x-axis direction), while a plurality of POLY lines 102 run orthogonally (e.g., y-axis direction) to the OD regions 104 in the horizontal direction. Utilizing this layout scheme, the height of the cell grid remains the same and equals the pitch of the POLY lines 102 multiplied by the number of pitches between the POLY lines 102 in the cell grid (6 in this example) in the cell grid, i.e., 6X as shown in FIG. 2A. The width of the cell grid, however, is now determined by the pitch Y of the fin-shaped OD regions 104 multiplied by the number of positions or spots occupied by one or more fin-shaped OD regions 104 in the cell grid, where the width of each spot along the horizontal direction is equal to the width of an OD region 104. In the example shown in FIG. 2A, the width of the cell grid as defined by the fin-shaped OD regions 104 is equal to 4Y (i.e., 3 spaces between the 4 staggered OD regions 104 plus 2 half spaces on the left and right sides of the cell grid to provide a total of 4 spaces or pitches). Each position is occupied by two vertically oriented OD regions 104 for a total of 8 fin-shaped OD regions 104, each set of 2 vertically oriented OD regions 104 being staggered with respect to an adjacent set of 2 vertically oriented OD regions 104. As such, the area of the cell grid in FIG. 2A is $6X*4Y=12X^2$ with X=2Y, which is significantly less than the layout area of the same cell grid shown in FIG. 1A ($18X^2$ to $12X^2$).

As illustrated by the example of FIG. 2A, when the height of the cell grid is per-determined and is generally not changed during the layout phase, a significant reduction in layout area of the cell grid can be achieved by defining the cell grid width based on the pitch of the fin-shaped OD regions 104, which can be smaller than the pitch of the POLY lines 102, wherein multiple fin-shaped OD regions 104 can be staggered at the same horizontal position to eliminate space taken by spots 110 unoccupied by the fin-shaped OD regions 104 in FIG. 1A. For another example, FIG. 2B shows an exemplary layout of the same cell grid of FIG. 1B, but the width of the cell grid is defined by the pitch Y of the fin-shaped OD regions 104 instead of the pitch X of the POLY lines 102. Since the example of the cell grid layout shown in FIG. 2B has fewer number of fin-shaped OD regions 104 than the example of FIG. 2A (4 vs. 8), the width of the cell grid as defined by the fin-shaped OD regions 104 is equal to 2Y (i.e., one space between the 2 staggered OD regions 104 plus 2 half spaces on the left and right sides of the cell grid to provide a total of 2 spaces or pitches). As such, the area of the cell grid now equals $6X*2Y=6X^2$ with X=2Y, resulting in even greater reduction in layout area of the cell grid compared to the layout of the same cell grid in FIG. 1B ($18X^2$ to $6X^2$).

Figure 3A:
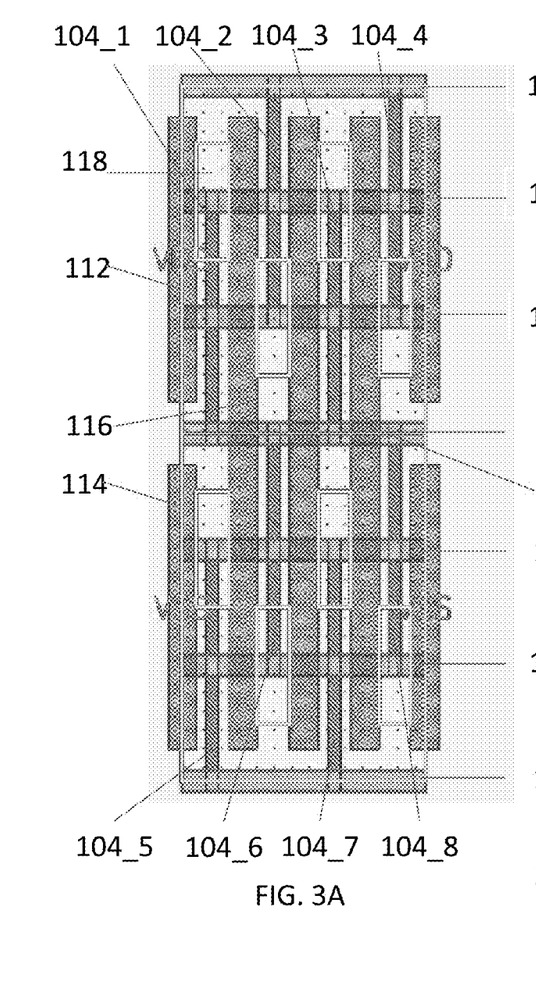
FIGS. 3A-B show various expanded ("unfolded") views of the exemplary cell grid layout of FIG. 2A, in accordance with some embodiments.
Figure 3B:
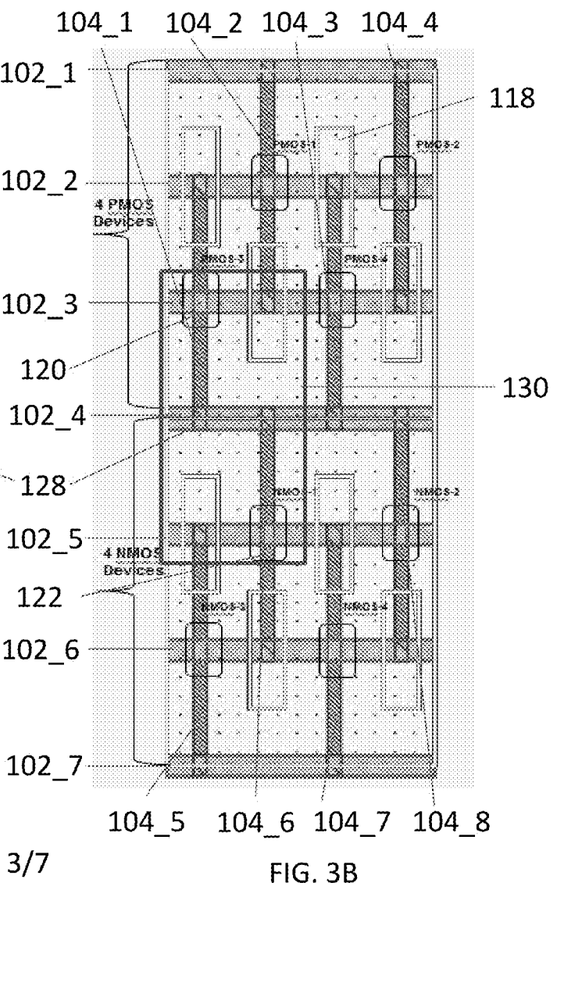

FIGS. 3A and 3B show various expanded ("unfolded") views of the exemplary layout of the cell grid of FIG. 2A, where the widths of each cell grids is defined by the pitch Y of the fin-shaped OD regions 104. FIG. 3A shows a layout view of the cell grid including POLY lines, OD regions, Cut-POLYs, and vertical metal lines in the cell grid. As shown in FIG. 3A, a plurality of POLY lines 102_1 to 102_7 are arranged as evenly spaced horizontal segments across the cell grid, while the fin-shaped OD regions 104_1 to 104_4 are vertically placed and staggered at several horizontal positions across the cell grid. Power lines 112 and 114 are vertical metal lines connecting to high voltage source VDD and low voltage source VSS, respectively. Vertical metal lines 116 are used to interconnect various devices in the cell grid.

FIG. 3B further shows a plurality of PMOS devices 120 and a plurality of NMOS devices 122 implemented (and staggered) in the cell grid. Since multiple PMOS or NMOS devices may share the same POLY line 102 as shown in FIG. 3B, Cut-POLYs (CPOs) 118 cut each POLY line 102 shared by multiple PMOS or NMOS devices into multiple unconnected segments so that each of the PMOS devices 120 or the NMOS devices 122 is an independent device in the cell grid having its own POLY line segment. CPO's 118 are POLY cutting components utilized to cut each POLY line 102 shared by multiple devices into separate pieces. As shown in FIG. 3B, each of the PMOS devices 120 and the NMOS devices 122 has its gate connected to one of the POLY lines (e.g., 102_2, 102_3, 102_5 and 102_6, respectively), which carry input signals to their respective gates. The sources and drains of each of the PMOS and NMOS devices are formed in their respective fin-shaped OD regions 104_1 to 104_8. In some embodiments, the OD regions in which drains of the PMOS and NMOS devices are formed are connected by POLY lines 102_1, 102_4, and 102_7, respectively. In some embodiments, one or more PMOS devices 120 (e.g., PMOS-3) and one or more NMOS devices 122 (e.g., NMOS-1) can be connected together to create a CMOS device 130. For a non-limiting example, as shown in FIG. 3B, the drain of PMOS device 120 (e.g., PMOS-3) formed in its respective OD region 104_1 is connected to the drain of NMOS device 122 (e.g., NMOS_1) formed in its respective OD region 104_6 by connecting the two OD regions 104 to POLY line 102_4 by means of contact vias 128. In some embodiments, the POLY lines 102_3 and 102_5 carrying input signals to the gates of PMOS-3 and NMOS-1, respectively, may also be connected by a connecting wire (not shown) so that the two devices can share a common input. In this way, PMOS-3 and NMOS-1 may form a CMOS device 130 with their drains connected together and their gate inputs connected together, respectively. The source of the PMOS-3 device, which is formed in the OD region 104_1 above the PMOS-4 device, and the source of the NMOS-1 device, which is formed in the OD region 104_6 below the NMOS-1 device, are isolated from other devices via respective CPO's 118. In some embodiments, the sources of PMOS-3 and NMOS-1 are connected to VDD and VSS, respectively, via conductive segments or lines (not shown). Additional CMOS devices 130 can be formed among other pairs of PMOS devices 120 and NMOS devices 122 (e.g., PMOS-4 and NMOS-2) in a similar fashion. Additionally, it is understood that various connections between the drains, sources and/or gates of the PMOS devices 120 and the NMOS devices 122 may be made to form various types of CMOS devices, as may be desired.

Figure 4A:
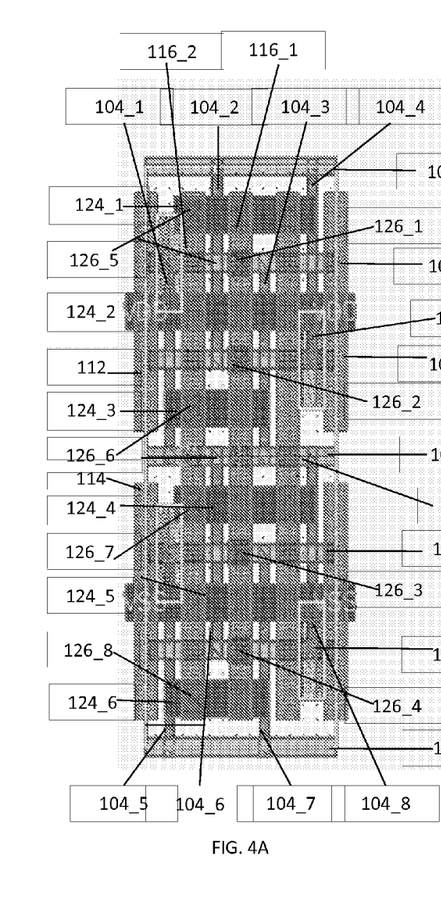
FIGS. 4A-B show various expanded views of another exemplary layout of the cell grid of FIG. 3A-B, where the devices are all connected together to form one CMOS inverter, in accordance with some embodiments.
Figure 4B:
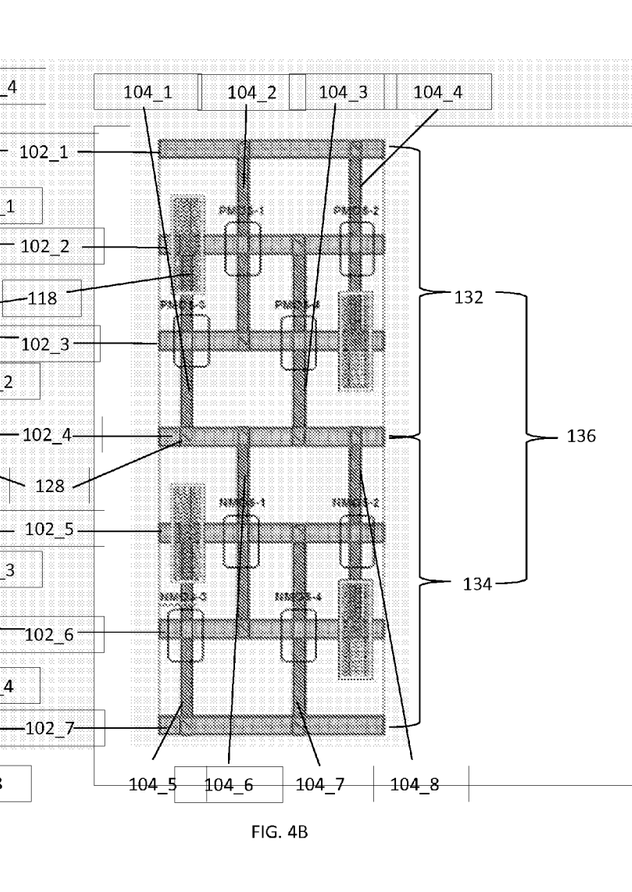

FIGS. 4A-B show various expanded views of another embodiment of the layout of the cell grid of FIG. 3A-B, illustrating how two or more PMOS devices can be connected together in parallel to form one larger PMOS device and how two or more NMOS devices can be connected together in parallel to form one larger NMOS device. The layout of the POLY lines 102_1 to 102_7 and the OD regions 104_1 to 104_8 in FIGS. 4A-B are the same as shown in FIG. 3A-B. FIG. 4A shows a layout view of the cell grid, in accordance with one embodiment. Compared to the layout as shown in the example of FIG. 3A, the layout depicted in FIG. 4A further includes horizontal metal lines 124_1 to 124_6, which are on a different metal layer from the vertical metal lines and can be connected to the vertical metal lines 112, 114, and 116 by metal contacts/vias 126. As shown in FIG. 4A, metal line 116_1 connects POLY lines 102_2, 102_3, 102_5, and 102_6 together through vias 126_1 to 126_4, respectively, wherein these POLY lines carry input to the gates of the PMOS devices 120 and NMOS devices 122. As such, all the PMOS devices 120 and NMOS devices 122 share the same input. Similarly, metal line 116_2 connects horizontal metal lines 124_1, 124_3, 124_4, and 124_6 together through vias 126_5 to 126_8, respectively. In some embodiments, these horizontal metal lines carry output from drains of the PMOS devices 120 and NMOS devices 122 as required by circuit design/layout rules. As such, all the PMOS devices 120 and NMOS devices 122 share the same output. Horizontal metal lines 124_2 and 124_5 connect to VDD vertical metal lines 112 and VSS vertical metal lines 114, respectively. Cut-POLYs (CPOs) 118 are utilized to terminate certain POLY lines 102 shared by multiple devices. Since multiple PMOS devices 120 and NMOS device 122 now share the same input, a fewer number of CPOs 118 are needed in the example of FIGS. 4A and 4B (4 CPOs) compared to the example of FIGS. 3A-B (8 CPOs).

FIG. 4B shows a plurality of PMOS devices 120 and a plurality of NMOS devices 122 implemented (and staggered) in the cell grid in addition to POLY lines 102, fin-shaped OD regions 104 and Cut-POLYs 118 in FIG. 4A. In some embodiments, the drains of two or more PMOS devices (e.g., PMOS-3 and PMOS-4) formed in their respective fin-shaped OD regions 104_1 and 104_3 may be electrically coupled to each other by POLY line 102_4 through contact vias 128 so that the PMOS devices share the same drain (their sources can be connected to VDD via, e.g., horizontal metal lines 124_2 shown in FIG. 4A). Since the PMOS devices 120 also share the same input and output as discussed for FIG. 4A above, they are now connected in parallel (i.e., they share the same source, drain/output, and gate/input) to form one larger PMOS device 132 having multiple times of width of a single PMOS device 120. Note that, in alternative embodiments, various alternative connections between PMOS devices 120 and NMOS devices 122 may be made to form alternative circuits and or devices, as may be desired, which differ from the specific connections shown in FIG. 4B. For example, the drains of additional PMOS devices (e.g., PMOS-1 and PMOS-2 and/or additional PMOS devices not shown) may also be coupled to the drains of PMOS-3 and PMOS-4 via additional connecting component(s) (not shown) so all of the PMOS devices share the same drain.

For example, in one embodiment, the drain of PMOS-1, which is formed in a lower portion of fin-shaped OD region 104_2 that intersects POLY line 102_3, may be connected to the drains of PMOS-3 and PMOS-4, by extending the length of OD region 104_2 below POLY line 102_3 or, alternatively, providing a conductive segment (not shown) to electrically connect POLY line 102_3 to POLY line 102_4. In this case, since the drain of PMOS-1 is also connected to the gates of PMOS-3 and PMOS-4, connecting the drain of PMOS-1 to the drains of PMOS-3 and PMOS-4 would also connect the drain and gate of PMOS-3 together and the drain and gate of PMOS-4 together, such that PMOS-3 and PMOS-4 function as diodes. If such diode configuration is not desired, a cut-POLY 118 (not shown) can be formed around the intersection of OD region 104_2 and POLY line 102_3 to isolate the drain of PMOS-1 from the gates of PMOS-3 and PMOS-4, thereby allowing the drain of PMOS-1 to be connected to the drains of PMOS-3 and PMOS-4 without tying the respective gates of PMOS-3 and PMOS-4 to their respective drains. Similarly, the drain of PMOS-2, formed in the lower portion of fin-shaped OD region 104_4 that intersects POLY line 102_3, can be connected to the drains of PMOS-3 and PMOS-4 by extending the length of the OD region 104_4 below POLY line 102_3 or, alternatively, by providing a conductive segment (not shown) to connect POLY line 102_3 to POLY line 102_4. It is noted, as shown in FIG. 4B, the drain of PMOS-2 is isolated from the gates of PMOS-3 and PMOS-4 by a cut-POLY 118 surrounding the intersection of the fin-shaped OD-region 104_4 and POLY line 102_3. Thus, tying the drain of PMOS-2 to the drains of PMOS-3 and PMOS-4 would not connect the respective drains and gates of PMOS-3 and PMOS-4 together in a diode configuration. The above discussion merely describes exemplary connections that can be made in accordance with various alternative embodiments. It is understood that such various alternative embodiments are not limited to the specific connections described above or those shown in FIG. 4B.

Similarly, two or more of the NMOS devices 122 can also be connected in parallel to form one larger NMOS device 134 in a similar fashion to that discussed above for the PMOS devices 120. In some embodiments, the POLY line 102_4 connects the fin-shaped OD regions 104_1, 104_3, 104_6, and 104_8 where the drains of the PMOS devices 120 and the NMOS devices 122 are formed together via contact vias 128 so that the PMOS devices 120 and the NMOS devices 122 all share the same drain. As a result, the two larger PMOS device 132 and NMOS device 134 may form one CMOS device 136 having the same input and output with their drains connected together.

Besides taking up too much space of the cell grid, the example of the cell grid layout depicted in FIGS. 1A-B may suffer from another problem caused by the fin-shaped OD regions 104 arranged horizontally next to each other in close proximity where the pitch of the fin-shaped OD regions 104 is so small that different devices implemented in the cell grid may not be able to be cut or separated from one another.

Figure 5A:
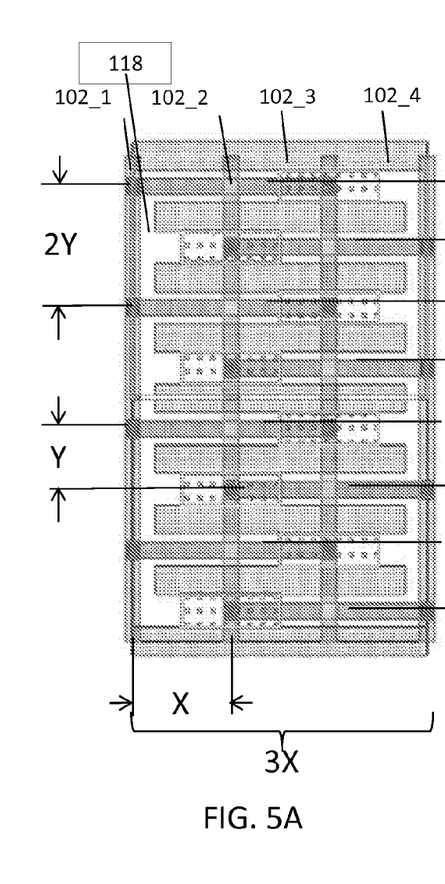
FIGS. 5A-B show various expanded views of an exemplary layout of the cell grid of FIG. 1A, where adjacent fin-shaped OD regions are interleaved and displaced from each other by a certain distance horizontally, in accordance with some embodiments.
Figure 5B:
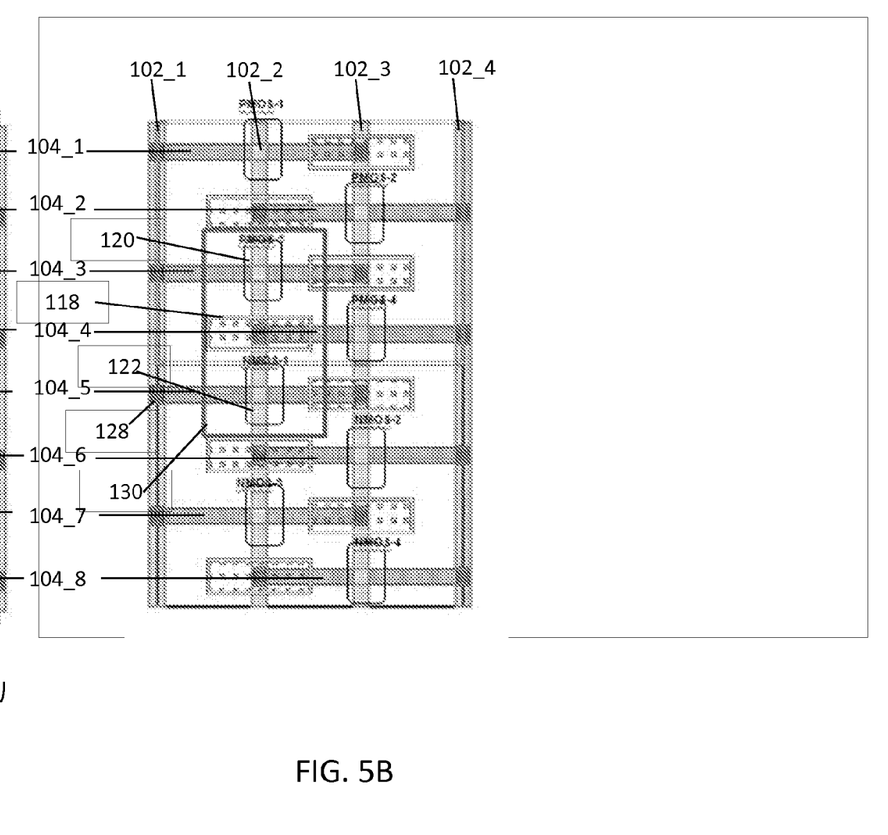

FIGS. 5A-B show various expanded views of an example of the layout of the cell grid of FIG. 1A to address the problem above, where the width of the cell grid is defined by pitch X of the POLY lines 102. FIG. 5A shows a layout view of the cell grid, in accordance with one embodiment. In this example, a plurality of POLY lines 102_1 to 102_4 are vertically arranged and evenly spaced while a plurality of fin-shaped OD regions are arranged in two adjacent groups (104_1, 104_3, 104_5, and 104_7) and (104_2, 104_4, 104_6, and 104_8) that are each interleaved and horizontally staggered from each other by a certain distance (e.g., by pitch 2Y) as shown in FIG. 5A. Under such horizontal displacement of the fin-shaped OD regions 104, the gap/separation between any two closest fin-shaped OD regions e.g., 104_1 and 104_3 or 104_2 and 104_4 at a position along the horizontal direction is at least 2Y instead of Y as shown in FIG. 5A. Since there is more space available between the fin-shaped OD regions (e.g., 104_1 and 104_3), it is possible to place a CPO 118 in the space between the fin-shaped OD regions to cut a POLY line (e.g., 102_2) shared by multiple PMOS devices 120 or NMOS devices 122 into unconnected pieces. As shown by the example of FIG. 5A, such horizontal displacement of the fin-shaped OD regions 104 does not result in an increase in the width of the cell grid which is defined by the pitch of the POLY lines 102, and equals 3X as shown in FIG. 5A, which is the same as the width of the layout in FIG. 1A.

FIG. 5B shows the PMOS/NMOS devices 120/122 in addition to the POLY lines 102, fin-shaped OD regions 104 and Cut-POLYs 118 shown in FIG. 5A. As shown in FIG. 5B, each of the PMOS devices 120 and the NMOS devices 122 has its gate connected to one of the POLY lines (e.g., 102_2 and 102_3, respectively) and its source and drain formed in one of the fin-shaped OD regions 104_1 to 104_8. In some embodiments, the OD regions in which drains of the PMOS and NMOS devices are formed are connected by POLY lines 102_1 and 102_4, respectively. Cut-POLYs (CPOs) 118 cut each POLY line 102_1 shared by multiple PMOS or NMOS devices into multiple segments so that each of the PMOS devices 120 or the NMOS devices 122 is an independent device having its own POLY line segment for its input signal. In some embodiments, one or more PMOS devices 120 (e.g., PMOS-3) and one or more NMOS devices 122 (e.g., NMOS-1) can be connected together to create a CMOS device 130. For a non-limiting example, as shown in FIG. 5B, the drain of PMOS device 120 (e.g., PMOS_3) formed in its respective OD region 104_3 is connected to the drain of NMOS device 122 (e.g., NMOS_1) formed in its respective OD region 104_5 by connecting the two OD regions 104_3 and 104_5 to POLY line 102_1 by means of contact vias 128. Additionally, in some embodiments, the drains of PMOS-1 and NMOS-3 of FIG. 5B are also connected to each other and to the drains of PMOS-3 and NMOS-1 by the connection of fin-shaped OD regions 104_1 and 104_7, respectively, to the POLY line 102_1.

In some embodiments, segments of the POLY line 102_2 carrying input signals to the gates of PMOS-3 and NMOS-1, respectively, may also be connected via a connecting segment (not shown) so that the two devices can share a common input. In this way, PMOS-3 and NMOS-1 may form a CMOS device 130 with their drains connected together, their gate inputs connected together, and their sources connected to VDD and VSS, respectively, via connecting segments (not shown). Additional CMOS devices 130 can be formed among other pairs of PMOS devices 120 and NMOS devices 122 (e.g., PMOS-4 and NMOS-2) in a similar fashion. As discussed above with respect to FIGS. 3B and 4B, two or more PMOS devices 120 can be connected to each other, two or more NMOS devices 122 can be connected to each other, or one or more PMOS devices 120 can be connected to one or more NMOS devices 122, in various ways to create various types of CMOS devices and circuits, in accordance with various alternative embodiments. It is understood that such alternative embodiments are not limited to the specific exemplary connections described above or illustrated in the figures.

Figure 6A:
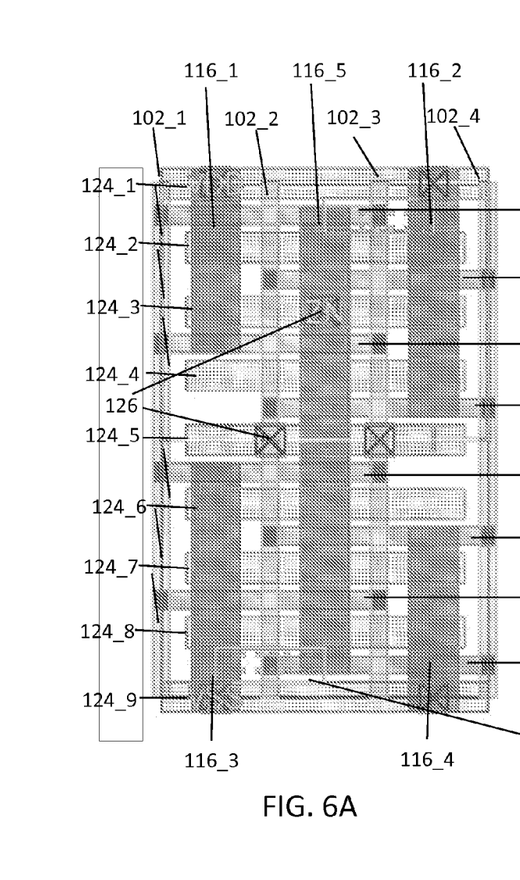
FIGS. 6A-B show various expanded views of another exemplary layout of the cell grid of FIGS. 5A-B, where the devices are all connected together to form one CMOS inverter, in accordance with some embodiments.
Figure 6B:
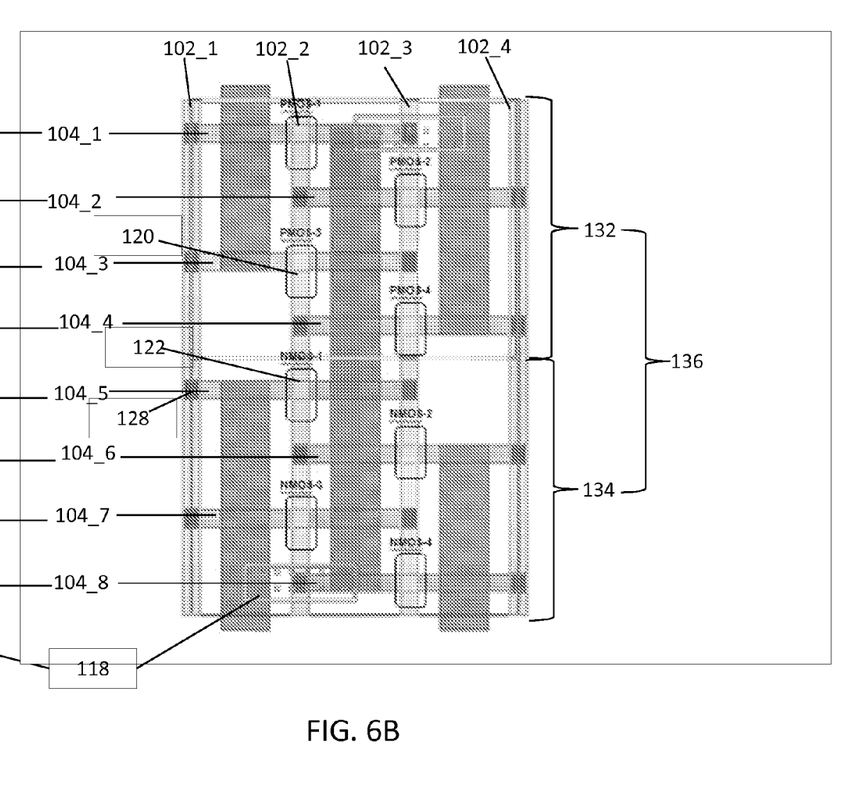

FIGS. 6A-B show various expanded views of another embodiment of layout of the cell grid of FIGS. 5A-B, illustrating how two or more PMOS devices can be connected together in parallel to form one larger PMOS device and how two or more NMOS devices can be connected together in parallel to form one larger NMOS device. The layout of the POLY lines 102_1 to 102_4 and the OD regions 104_1 to 104_8 in FIGS. 6A-B are the same as shown in FIG. 5A-B. FIG. 6A shows a layout view of the cell grid, in accordance with one embodiment. Compared to the layout as shown in the example of FIG. 5A, the layout depicted in FIG. 6A further includes vertical metal lines 116_1 to 116_5, which are on a different metal layer from the horizontal metal lines 124 and can be connected to the horizontal metal lines 124 and POLY lines 102 by contacts/vias 126. As shown in FIG. 6A, metal line 124_5 connects POLY lines 102_2 and 102_3 together through vias 126, wherein the POLY lines carry input to the gates of the PMOS devices 120 and NMOS devices 122. As such, the PMOS devices 120 and NMOS devices 122 share the same input. Similarly, vertical metal line 116_5 connects the horizontal metal lines (e.g., one or more of 124_2 to 124_4 and 124_6 to 124_8) carrying output from drains of the PMOS devices 120 and NMOS devices 122. As such, the PMOS devices 120 and NMOS devices 122 may share the same output/drain. Horizontal metal lines 124_1 and 124_9 connect to VDD vertical metal lines 116_1/116_2 and VSS vertical metal lines 116_3/116_4, respectively. Cut-POLYs (CPOs) 118 are utilized to terminate POLY line 102_1 or 102_2 shared by multiple devices. Since multiple PMOS devices 120 and/or NMOS devices 122 now share the same input, a fewer number of CPOs 118 are needed in the example of FIGS. 6A-B (2 CPOs) compared to the example of FIGS. 5A-B (8 CPOs).

FIG. 6B shows a plurality of PMOS/NMOS devices in addition to the POLY lines 102, fin-shaped OD regions 104, Cut-POLYs 118, and vertical metal lines 116 shown in FIG. 6A. In some embodiments, the drains of two or more PMOS devices (e.g., PMOS_1 and PMOS_3) formed in their respective fin-shaped OD regions 104_1 and 104_3 may be electrically coupled to each other by POLY line 102_1 through contact vias 128 so that the PMOS devices share the same drain. Their sources are connected to VDD as discussed with respect to FIG. 5B above. Since the PMOS devices 120 also share the same input/gate and output/drain as discussed for FIG. 6A above, they are now connected in parallel (i.e., they share the same source, drain/output and gate/input) to form one larger PMOS device 132 having multiple times the width of a single PMOS device 120. The NMOS devices 122 can also be connected in parallel to form one larger NMOS device 134 in a similar fashion. In some embodiments, the POLY line 102_1 connects the fin-shaped OD regions (e.g., 104_1, 104_3, 104_5, and 104_7) where the drains of the PMOS devices are connected together by the contact vias 128 so that the devices all share the same drain. As a result, the two larger PMOS device 132 and NMOS device 134 may form one CMOS device 136 having the same input and output with their drains connected together.

Figure 7:
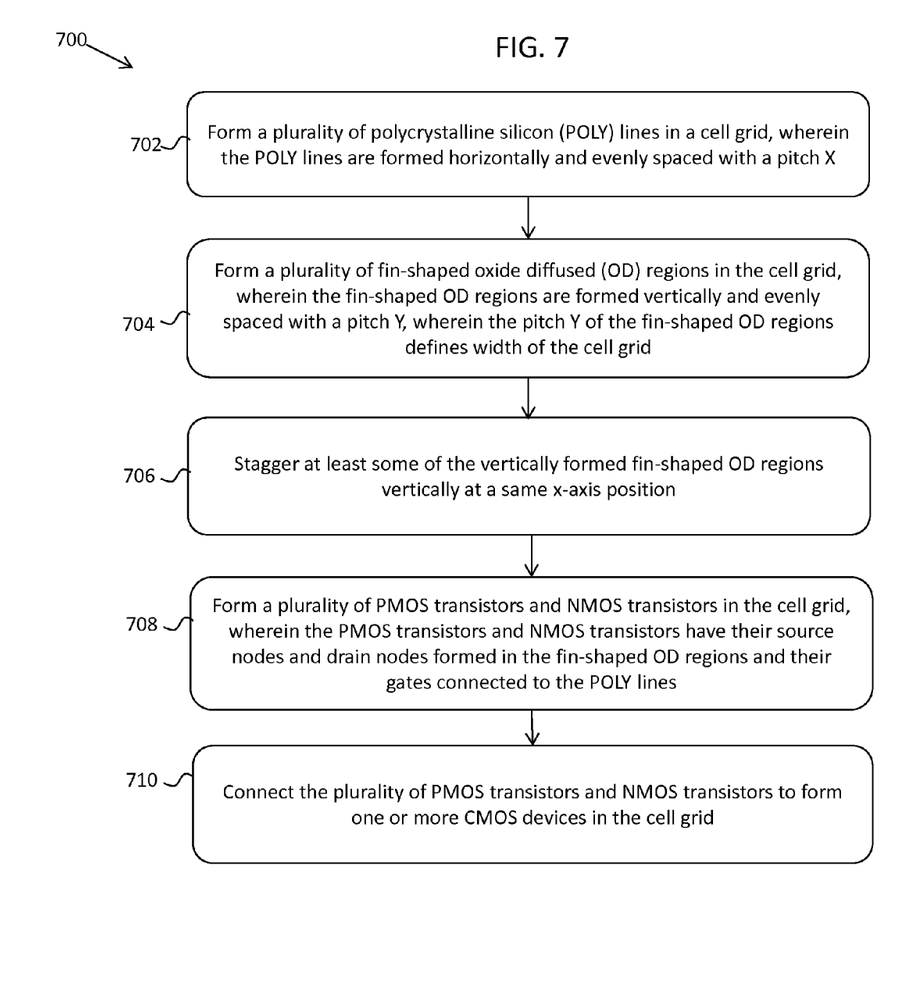
FIG. 7 is a flow chart of a method for forming a cell grid utilizing one or more FinFET devices wherein the width of the cell grid is defined by a pitch of the fin-shaped OD regions instead of a pitch of the POLY lines, in accordance with some embodiments.

FIG. 7 is a flow chart of a process 700 for forming a cell grid wherein the width of the cell grid is defined by a pitch of the fin-shaped OD regions instead of the POLY lines. Although reference numbers to components shown in FIGS. 2A-B and 3A-B are used below as non-limiting examples to illustrate the steps in FIG. 7. The process 700 is not limited to these examples or the particular order of steps shown.

At step 702, a plurality of polycrystalline silicon (POLY) lines 102 are formed in the cell grid, wherein the POLY lines 102 are formed horizontally and evenly spaced with a pitch X.

At step 704, a plurality of fin-shaped oxide diffused (OD) regions 104 are formed in the cell gird, wherein the fin-shaped OD regions 104 are formed vertically and evenly spaced with a pitch Y, wherein the pitch Y of the fin-shaped OD regions 104 defines width of the cell grid.

At step 706, at least some of the vertically formed fin-shaped OD regions 104 are staggered vertically at a same position along a horizontal direction.

At step 708, a plurality of PMOS transistors 120 and NMOS transistors 122 are formed in the cell grid, wherein the PMOS transistors 120 and NMOS transistors 122 have their source nodes and drain nodes formed in the fin-shaped OD regions 104 and their gates connected to respective ones of the POLY lines 102.

At step 710, the plurality of PMOS transistors 120 and NMOS transistors 122 are connected together to form one or more CMOS devices in the cell grid.

In some embodiments, a layout of a cell grid comprises a plurality of polycrystalline silicon (POLY) lines in the cell gird, wherein the POLY lines are arranged in a first direction and evenly spaced with a first pitch, and a plurality of fin-shaped oxide diffused regions in the cell gird, wherein the fin-shaped OD regions are arranged in a second direction and evenly spaced with a second pitch, wherein the second pitch of the fin-shaped OD regions defines width of the cell grid. The layout of the cell grid further comprises a plurality of PMOS transistors and NMOS transistors in the cell gird, wherein the PMOS transistors and NMOS transistors have their source nodes and drain nodes formed in the fin-shaped OD regions and their gates connected to respective ones of the POLY lines, wherein the plurality of PMOS transistors and NMOS transistors are connected together to form one or more CMOS devices in the cell grid.

In some embodiments, a layout of a cell grid comprises a plurality of polycrystalline silicon (POLY) lines in the cell gird, wherein the POLY lines are arranged in a second direction and evenly spaced with a first pitch, and a plurality of fin-shaped oxide diffused (OD) regions in the cell gird, wherein the fin-shaped OD regions are arranged in a first direction and evenly spaced with a second pitch, wherein adjacent fin-shaped OD regions are interleaved and displaced from each other by a distance horizontally. The layout of the cell grid further comprises a plurality of PMOS transistors and NMOS transistors in the cell gird, wherein the PMOS transistors and NMOS transistors have their source nodes and drain nodes formed in the fin-shaped OD regions and their gates connected to respective ones of the POLY lines, wherein the plurality of PMOS transistors and NMOS transistors are connected together to form one or more CMOS devices in the cell grid.

In some embodiments, a method comprises forming a plurality of polycrystalline silicon (POLY) lines in a cell gird, wherein the POLY lines are formed in a first direction and evenly spaced with a first pitch and forming a plurality of fin-shaped oxide diffused (OD) regions in the cell gird, wherein the fin-shaped OD regions are formed in a second direction and evenly spaced with a second pitch, wherein the second pitch of the fin-shaped OD regions defines width of the cell grid and the second pitch of the fin-shaped OD regions is smaller than the first pitch of the POLY lines. The method further comprises forming a plurality of PMOS transistors and NMOS transistors in the cell grid, wherein the PMOS transistors and NMOS transistors have their source nodes and drain nodes formed in the fin-shaped OD regions and their gates connected to respective ones of the POLY lines and connecting the plurality of PMOS transistors and NMOS transistors to form a plurality of separate CMOS devices in the cell grid.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A layout of a cell grid, comprising:
   a plurality of polycrystalline silicon (POLY) lines in the cell grid, wherein the POLY lines are arranged in a first direction and evenly spaced from each other with a first pitch;
   a plurality of fin-shaped oxide diffused (OD) regions in the cell grid, wherein the fin-shaped OD regions are arranged in a second direction that is orthogonal to the first direction and evenly spaced from each other with a second pitch, wherein the second pitch of the fin-shaped OD regions defines a width of the cell grid, and wherein a first one of the fin-shaped OD regions is disposed across a first plurality of POLY lines, and a second one of the fin-shaped OD regions, displaced from the first fin-shaped OD region by respective distances in the first and second directions, is disposed across a second plurality of POLY lines, wherein the first and second pluralities of POLY lines share at least one POLY line; and
   a plurality of PMOS transistors and NMOS transistors in the cell grid, wherein the plurality of PMOS transistors and NMOS transistors have their source nodes and drain nodes formed in respective ones of the fin-shaped OD regions and their gates connected to respective ones of the POLY lines;
   wherein the plurality of PMOS transistors and NMOS transistors are connected together to form one or more CMOS devices in the cell grid.

2. The cell grid of claim 1, wherein the second pitch of the fin-shaped OD regions is smaller than the first pitch of the POLY lines.

3. The cell grid of claim 1, wherein the width of the cell grid is determined by the second pitch of the fin-shaped OD regions multiplied by number of the fin-shaped OD regions in the cell grid.

4. The cell grid of claim 1, wherein a height of the cell grid is pre-determined.

5. The cell grid of claim 1, wherein at least some of the fin-shaped OD regions are staggered in the second direction at a same position along the first direction.

6. The cell grid of claim 1, wherein each of the CMOS devices is formed by connecting a drain of at least one PMOS device with a drain of at least one NMOS device and connecting a gate input of the at least one PMOS device with a gate input of the at least one NMOS device.

7. The cell grid of claim 1, further comprising:
   at least one poly line cutting component configured to cut at least one of the POLY lines shared by multiple PMOS or NMOS devices so that at least one of the PMOS devices or NMOS devices is an independent device in the cell grid.

8. The cell grid of claim 1, wherein two or more of the plurality of PMOS devices are connected in parallel to form one larger PMOS device, and two or more of the plurality of NMOS devices are connected in parallel to form one larger NMOS device.

9. The cell grid of claim 8, wherein the parallel-connected PMOS and NMOS devices form one larger CMOS device.

10. A layout of a cell grid, comprising:
    a plurality of polycrystalline silicon (POLY) lines in the cell grid, wherein the POLY lines are arranged in a second direction and evenly spaced from each other with a first pitch;
    a plurality of fin-shaped oxide diffused (OD) regions in the cell grid, wherein the fin-shaped OD regions are arranged in a first direction and evenly spaced from each other with a second pitch, and wherein a first one of the fin-shaped OD region is disposed across a first POLY line, a second POLY line, and a third POLY line, and coupled to the first and third POLY lines at respective ends of the first fin-shaped OD region with the second POLY line sandwiched between the first and third POLY lines, and a second one of the fin-shaped OD region, displaced from the first fin-shaped OD region by a distance in the first direction, is disposed across the second POLY line, the third POLY line, and a fourth POLY line, and coupled to the second and fourth POLY lines at respective ends of the second fin-shaped OD region with the third POLY line sandwiched between the second and fourth POLY lines; and
    a plurality of PMOS transistors and NMOS transistors in the cell grid, wherein the PMOS transistors and NMOS transistors have their source nodes and drain nodes formed in the fin-shaped OD regions and their gates connected to respective ones of the POLY lines;
    wherein the plurality of PMOS transistors and NMOS transistors are connected together to form one or more CMOS devices in the cell grid.

11. The cell grid of claim 10, wherein a spacing between any two closest fin-shaped OD regions at any point along the first direction is at least two times the second pitch.

12. The cell grid of claim 11, wherein one or more poly line cutting components placed between the two closest fin-shaped OD regions and configured to cut the a POLY shared by multiple PMOS devices or the NMOS devices so that they are physically separated into different devices.

13. The cell grid of claim 10, wherein two or more of the plurality of PMOS devices are connected together to form one larger PMOS device, and two or more of the plurality of NMOS devices are connected in parallel to form one larger NMOS device.

14. The cell grid of claim 13, wherein the parallel-connected PMOS and NMOS devices form one larger CMOS device.

15. A method, comprising:
    forming a plurality of polycrystalline silicon (POLY) lines in a cell grid, wherein the POLY lines are formed in a first direction and evenly spaced from each other with a first pitch;
    forming a plurality of fin-shaped oxide diffused (OD) regions in the cell grid, wherein the fin-shaped OD regions are formed in a second direction and evenly spaced from each other with a second pitch, wherein the second pitch of the fin-shaped OD regions defines a width of the cell grid and the second pitch of the fin-shaped OD regions is smaller than the first pitch of the POLY lines, and wherein a first one of the fin-shaped OD region is disposed across a first plurality of POLY lines, and a second one of the fin-shaped OD region, displaced from the first fin-shaped OD region by respective distances in the first and second directions, is disposed across a second plurality of POLY lines, wherein the first and second pluralities of POLY lines share at least one POLY line;
    forming a plurality of PMOS transistors and NMOS transistors in the cell grid, wherein the PMOS transistors and NMOS transistors have their source nodes and drain nodes formed in the fin-shaped OD regions and their gates connected to respective ones of the POLY lines; and
    connecting the plurality of PMOS transistors and NMOS transistors to form a plurality of separate CMOS devices in the cell grid.

16. The method of claim 15, further comprising:
determining the width of the cell grid by multiplying the second pitch of the fin-shaped OD regions with number of the fin-shaped OD regions in the cell grid.

17. The method of claim 15, further comprising:
staggering at least some of the fin-shaped OD regions in the second direction at a same position along the first direction.

18. The method of claim 15, further comprising:
forming each of the CMOS devices by connecting respective gate inputs of at least one PMOS device with respective gate inputs of at least one NMOS device and connecting respective drain node of the at least one PMOS device with respective drain node of the at least one NMOS device.

19. The method of claim 15, further comprising:
forming at least one poly line cutting component configured to cut at least one of the POLY lines shared by multiple PMOS or NMOS devices so that at least one of the PMOS devices or NMOS devices is an independent device in the cell grid.

20. The method of claim 15, further comprising:
connecting inputs of the plurality of PMOS devices in parallel and connecting outputs of the plurality of PMOS devices in parallel, to form one larger PMOS device, and connecting inputs of the plurality of NMOS devices in parallel and outputs of the plurality of NMOS devices in parallel to form one larger NMOS device.

* * * * *